(12) United States Patent
Huang et al.

(10) Patent No.: US 8,344,802 B2
(45) Date of Patent: Jan. 1, 2013

(54) OPERATIONAL AMPLIFIER DEVICE

(75) Inventors: Ju-Lin Huang, Hsinchu County (TW); Peng-Yu Chen, Hsinchu (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/090,254

(22) Filed: Apr. 20, 2011

(65) Prior Publication Data

US 2012/0188012 A1 Jul. 26, 2012

(30) Foreign Application Priority Data

Jan. 24, 2011 (TW) .............................. 100102469 A (51) Int. Cl.
*H03F 3/45* (2006.01)
(52) U.S. Cl. ......................................... 330/253; 330/69
(58) Field of Classification Search .................... 330/69, 330/98, 150, 253
See application file for complete search history.

(56) References Cited

U.S. PATENT DOCUMENTS

| | | | | |
|---|---|---|---|---|
| 5,111,064 | A * | 5/1992 | Ward | 327/108 |
| 6,147,541 | A * | 11/2000 | Seesink | 327/337 |
| 7,518,440 | B1 * | 4/2009 | Trifonov | 330/9 |
| 7,586,368 | B2 * | 9/2009 | Trifonov | 330/9 |
| 7,986,290 | B2 * | 7/2011 | Yang | 345/87 |

* cited by examiner

*Primary Examiner* — Henry Choe
(74) *Attorney, Agent, or Firm* — Winston Hsu; Scott Margo (57) ABSTRACT

An operational amplifier device includes an operational amplifier, a first transmission gate, and a first switch module. The operational amplifier includes an output stage, which has a first signal input terminal and a signal output terminal, and outputs an output voltage at the signal output terminal. The first transmission gate is coupled between the signal output terminal and a transmission output terminal, having a first transmission control terminal. The first switch module is utilized for controlling electrical connection between the first signal input terminal and the first transmission control terminal. During a first transmission period, the first switch module controls the first transmission control terminal to be coupled to the first signal input terminal, thereby conducting the first transmission gate to not only transmit the output voltage but also act as a Miller capacitor.

19 Claims, 5 Drawing Sheets

OPERATIONAL AMPLIFIER DEVICE

BACKGROUND OF THE INVENTION

1. Field of the Invention

The present invention relates to an operational amplifier device, and more particularly, to an operational amplifier device capable of using transmission gates for capacitance compensation.

2. Description of the Prior Art

Generally, a transmission gate is implemented by an N-TYPE metal-oxide-semiconductor transistor and a P-TYPE metal-oxide-semiconductor transistor. Via adjusting gate voltages of the N-TYPE metal-oxide-semiconductor transistor and the P-TYPE metal-oxide-semiconductor transistor, it is possible to control a turning on and turning off of the transmission gate, to decide whether to output a voltage received by the transmission gate through a transmission output terminal to an external load, e.g. to transmit an output voltage of an operational amplifier to an external load.

Figure 1A:
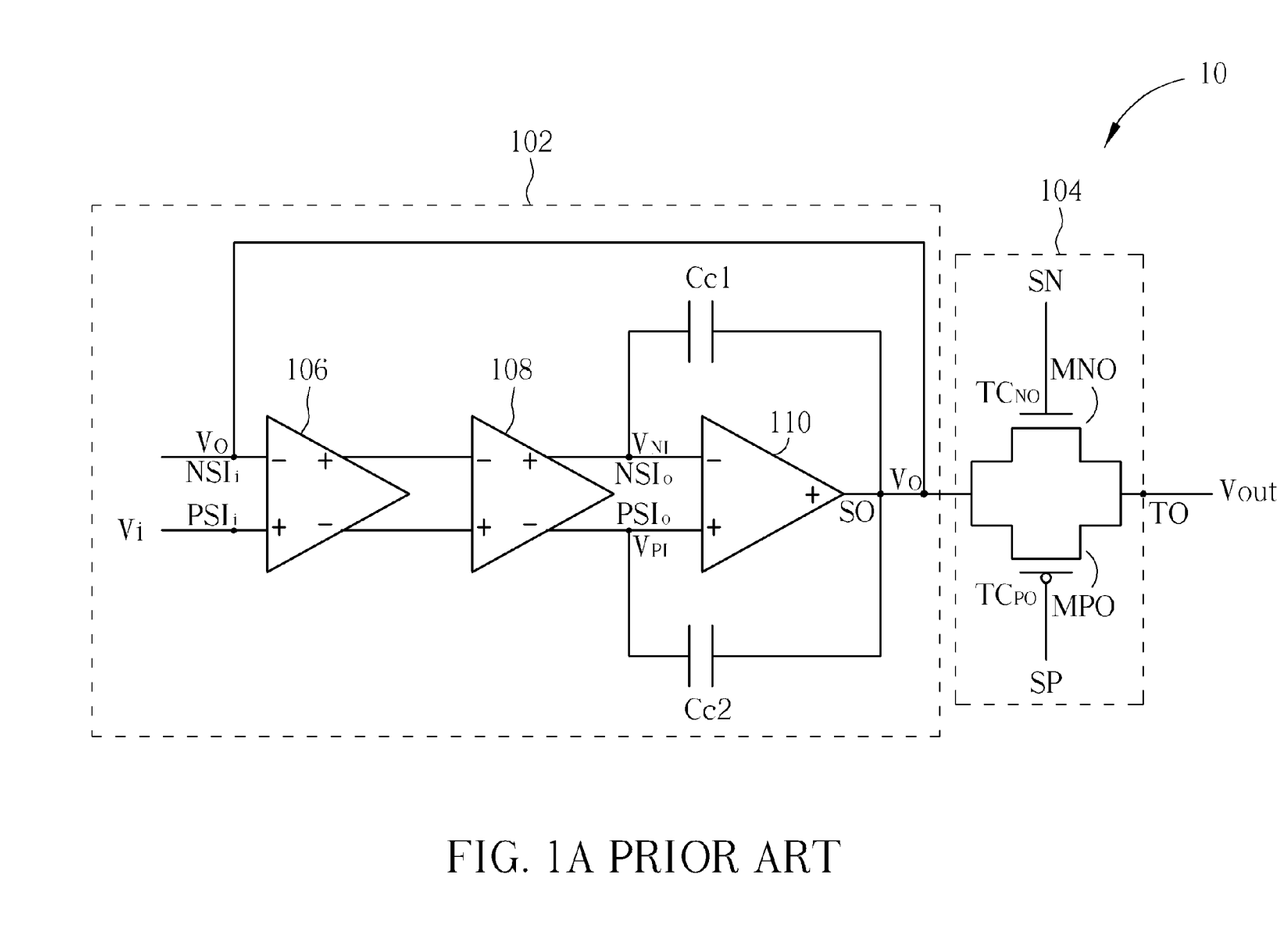
FIG. 1A is a schematic diagram of a conventional operational amplifier device.

For example, please refer to FIG. 1A, which is a schematic diagram of a conventional operational amplifier device 10. As shown in FIG. 1A, the operational amplifier device 10 includes an operational amplifier 102 and a transmission gate 104. The operational amplifier 102 includes an input stage 106, a gain stage 108 and an output stage 110, and the transmission gate 104 includes an N-TYPE metal-oxide-semiconductor transistor MN0 and a P-TYPE metal-oxide-semiconductor transistor MP0. Simply put, when levels of an input voltage Vi of a positive signal input terminal $PSI_i$ of the input stage 106 change, the gain stage 108 charges or discharges Miller capacitors Cc1 and Cc2, to raise or lower a voltage $V_{PI}$ of a positive signal input terminal PSI, and a voltage $V_{NI}$ of a negative signal input terminal $NSI_o$ of the output stage 110, so as to change levels of an output voltage Vo outputted by a signal output terminal SO of the output stage 110. Moreover, since the signal output terminal SO of the output stage 110 and a negative signal input terminal $NSI_i$ of the input stage 106 are coupled to form a negative feedback loop, the levels of the output voltage Vo can be maintained at the levels of the input voltage Vi. Furthermore, it is possible to further control a turning on and turning off of the transmission gate 104 coupled between the signal output terminal SO and a transmission output terminal TO via adjusting transmission control signals SN and SP that are coupled to transmission control terminals $TC_{N0}$, $TC_{P0}$ (e.g. gate terminals) of the N-TYPE metal-oxide-semiconductor transistor MN0 and the P-TYPE metal-oxide-semiconductor transistor MP0, respectively, so as to decide whether the transmission gate 104 transmits the received output voltage Vo to the output terminal TO to provide an output voltage Vout to an external load.

Figure 1B:
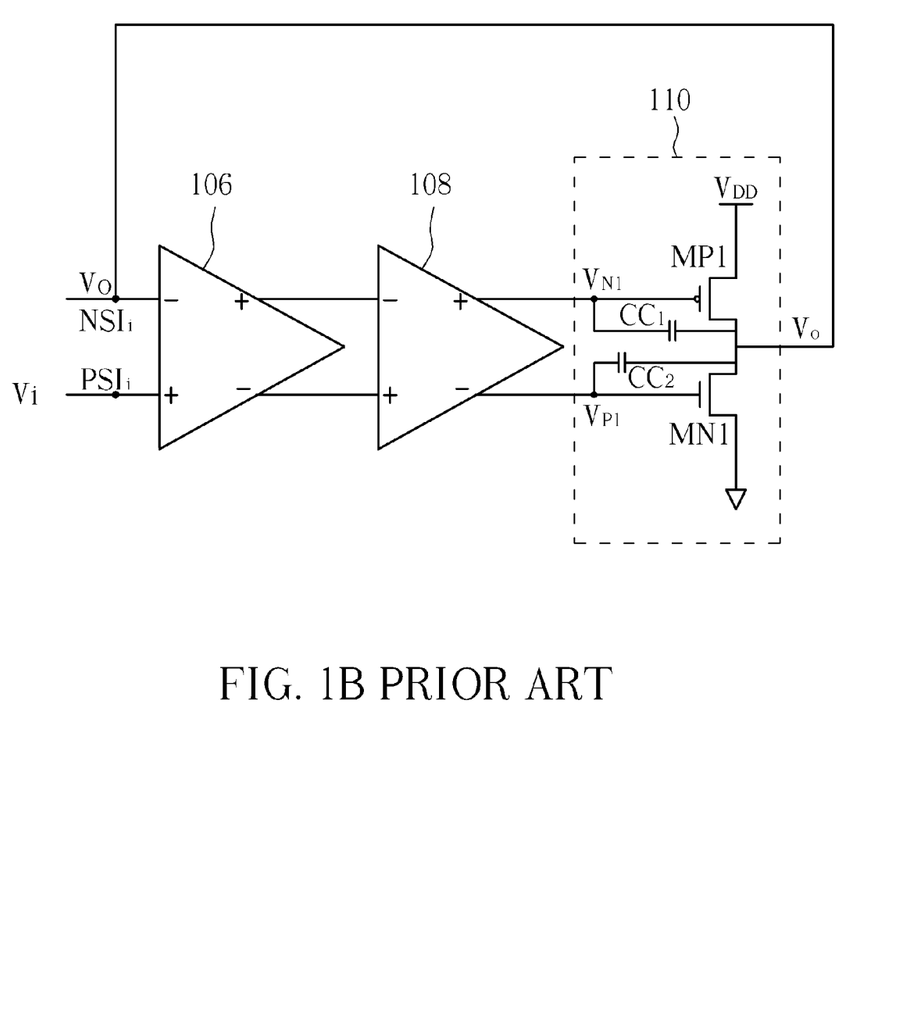
FIG. 1B is a schematic diagram of an output stage shown in FIG. 1A.

Specifically, please refer to FIG. 1B, which is a schematic diagram of details of the output stage 110 in FIG. 1A. As shown in FIG. 1B, the output stage 110 further includes an N-TYPE metal-oxide-semiconductor transistor MN1 and a P-TYPE metal-oxide-semiconductor transistor MP1. When the input voltage Vi switches to a high level, the gain stage 108 discharges the Miller capacitors Cc1 and Cc2 to lower the voltages $V_{PI}$ and $V_{NI}$, to turn on the P-TYPE metal-oxide-semiconductor transistor MP1 and turn off the N-TYPE metal-oxide-semiconductor transistor MN1, such that a system voltage $V_{DD}$ charges the output voltage Vo, in turn raising the output voltage Vo to a high voltage level of the input voltage Vi. Conversely, when the input voltage Vi switches to a low voltage level, the gain stage 108 charges the Miller capacitors Cc1 and Cc2 to raise the voltages $V_{PI}$ and $V_{NI}$, to turn on the N-TYPE metal-oxide-semiconductor transistor MN1 and turn off the P-TYPE metal-oxide-semiconductor transistor MP1, such that a grounding terminal discharges the output voltage Vo, in turn lowering the output voltage Vo to a low voltage level of the input voltage Vi.

Figure 1C:
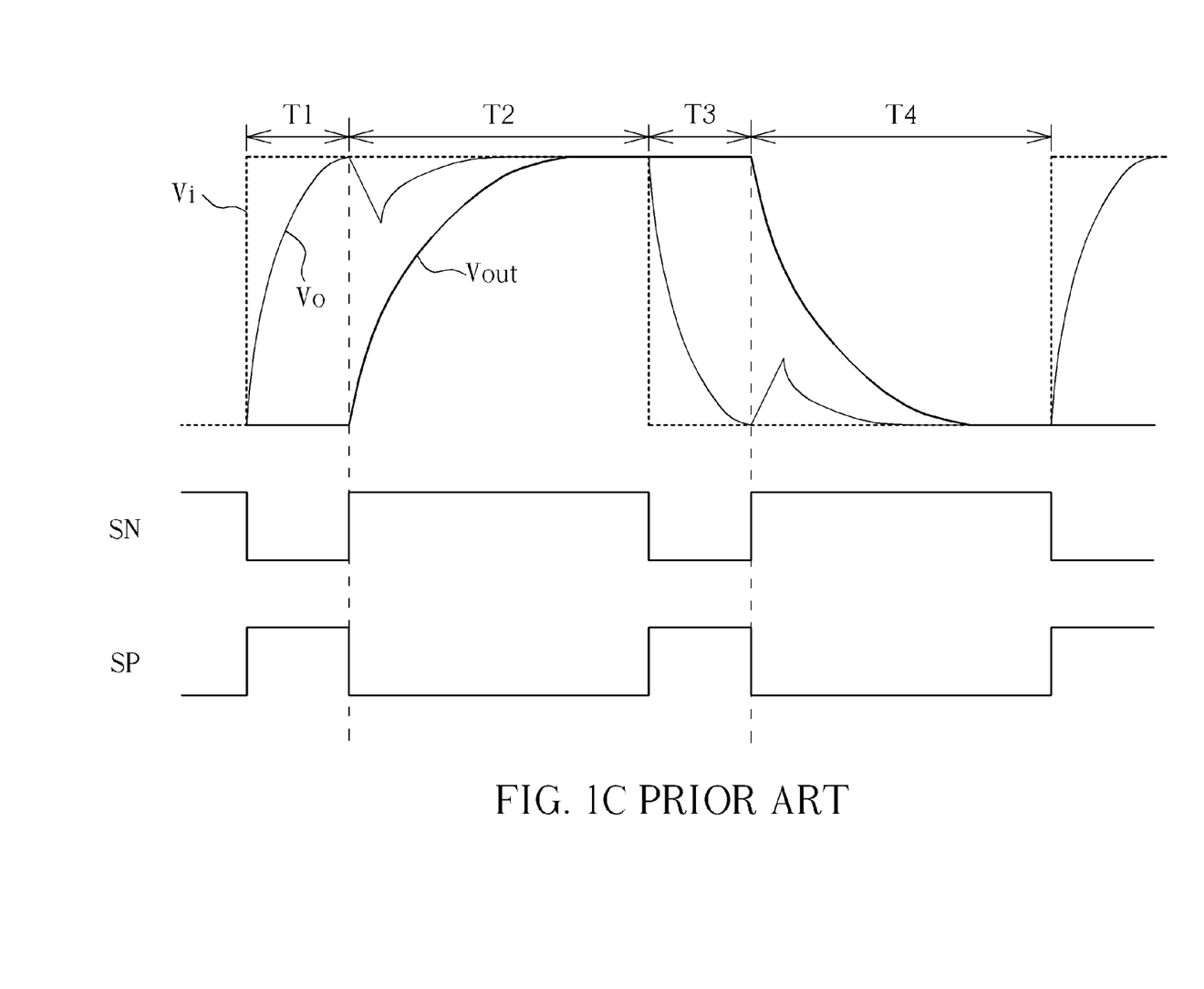
FIG. 1C is a schematic diagram of an input voltage, output voltages and transmission control signals shown in FIG. 1A.

On the other hand, please refer to FIG. 1C, which is a schematic diagram of the input voltage Vi, the output voltages Vo, Vout and the transmission control signals SN and SP in FIG. 1A. As shown in FIG. 1C, during a charge period T1, the input voltage Vi is at a high voltage level, and the transmission control signals SN and SP are at a low voltage level and a high voltage level, respectively; thus, the transistors MN0 and MP0 of the transmission gate 104 are both turned off, causing the output voltage Vout of the transmission output terminal to be at a low voltage level (e.g. 0). Moreover, since the input voltage Vi is at a high voltage level, the gain stage 108 discharges the Miller capacitors Cc1 and Cc2 to raise the output voltage Vo to a high voltage level of the input voltage Vi, as mentioned. Next, during a positive voltage transmission period T2, the transmission control signals SN and SP are switched to a high voltage level and a low voltage level, respectively. Therefore, the transistors MN0 and MP0 of the transmission gate 104 are both conducting; the output voltage Vout of the transmission output terminal TO rises after receiving an output voltage Vo of a high voltage level, and the output voltage Vo falls due to charge sharing with the output voltage Vout. However due to negative feedback, the gain stage 108 would again discharge the Miller capacitors Cc1 and Cc2 to raise the output voltage Vo to a high voltage level of the input voltage Vi, and also raise the output voltage Vout of the transmission output terminal TO to a high voltage level of the input voltage Vi. Conversely, an opposite operation of the above-mentioned applies when the input voltage Vi is at a low voltage level during a discharge period T3 and a negative voltage transmission period T4, and thus is not described here in further detail.

A conventional method for increasing stability of operational amplifiers is to use a bigger Miller capacitor. However this increases internal charge and discharge time of the Miller capacitor in the operational amplifiers, i.e. more time is needed to lower or raise a level of the output voltage Vo to that of the input voltage Vi. Consequently, if the transmission gate is turned on before the Miller capacitor is fully charged or discharged, the output stage of the operational amplifier cannot be fully turned on, causing the level of the output voltage Vo to fall short of that of the input voltage Vi, i.e. a slower charge/discharge rate of the load. Hence, it is necessary to improve over the prior art, to increase stability of operational amplifiers without increasing charge and discharge time.

SUMMARY OF THE INVENTION

Therefore, a primary objective of the disclosure is to provide an operational amplifier device capable of utilizing transmission gates for capacitance compensation, thus allowing use of a smaller Miller capacitor, or even excluding the Miller capacitors altogether.

An embodiment discloses an operational amplifier device. The operational amplifier device includes an operational amplifier having an output stage, which includes a first signal input terminal and a signal output terminal, and outputs an output voltage at the signal output terminal; a first transmission gate, coupled between the signal output terminal and a transmission output terminal, and comprising a first transmission control terminal; and a first switch module, for controlling an electrical connection between the first signal input terminal and the first transmission control terminal. During a first transmission period, the first switch module controls the first transmission control terminal to be coupled to the first signal input terminal, thereby conducting the first transmission gate to transmit the output voltage.

Another embodiment discloses an operational amplifier device. The operational amplifier device includes an operational amplifier, including an output stage, which includes a plurality of signal input terminals and a signal output terminal for outputting an output voltage; a plurality of transmission gates, coupled in parallel between the signal output terminal and a transmission output terminal, and each having one of a plurality of transmission control terminals, respectively; and a plurality of switch modules, each for controlling an electrical connection between the signal input terminal and a corresponding transmission control terminal of the plurality of transmission control terminals. During a transmission period, at least one of the plurality of switch modules controls the at least one corresponding signal input terminal to be electrically connected to the at least one corresponding transmission control terminal, thereby conducting the at least one corresponding transmission gate.

Another embodiment further discloses an operational amplifier device. The operational amplifier device includes an operational amplifier, comprising an output stage for outputting an output voltage; a transmission gate, coupled to the output stage for receiving the output voltage; and a switch module, for controlling an electrical connection between the transmission gate and the output stage. During a transmission period, the switch module controls the transmission gate to conduct to transmit the output voltage and to act as a Miller capacitor to compensate for the output voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 2A:
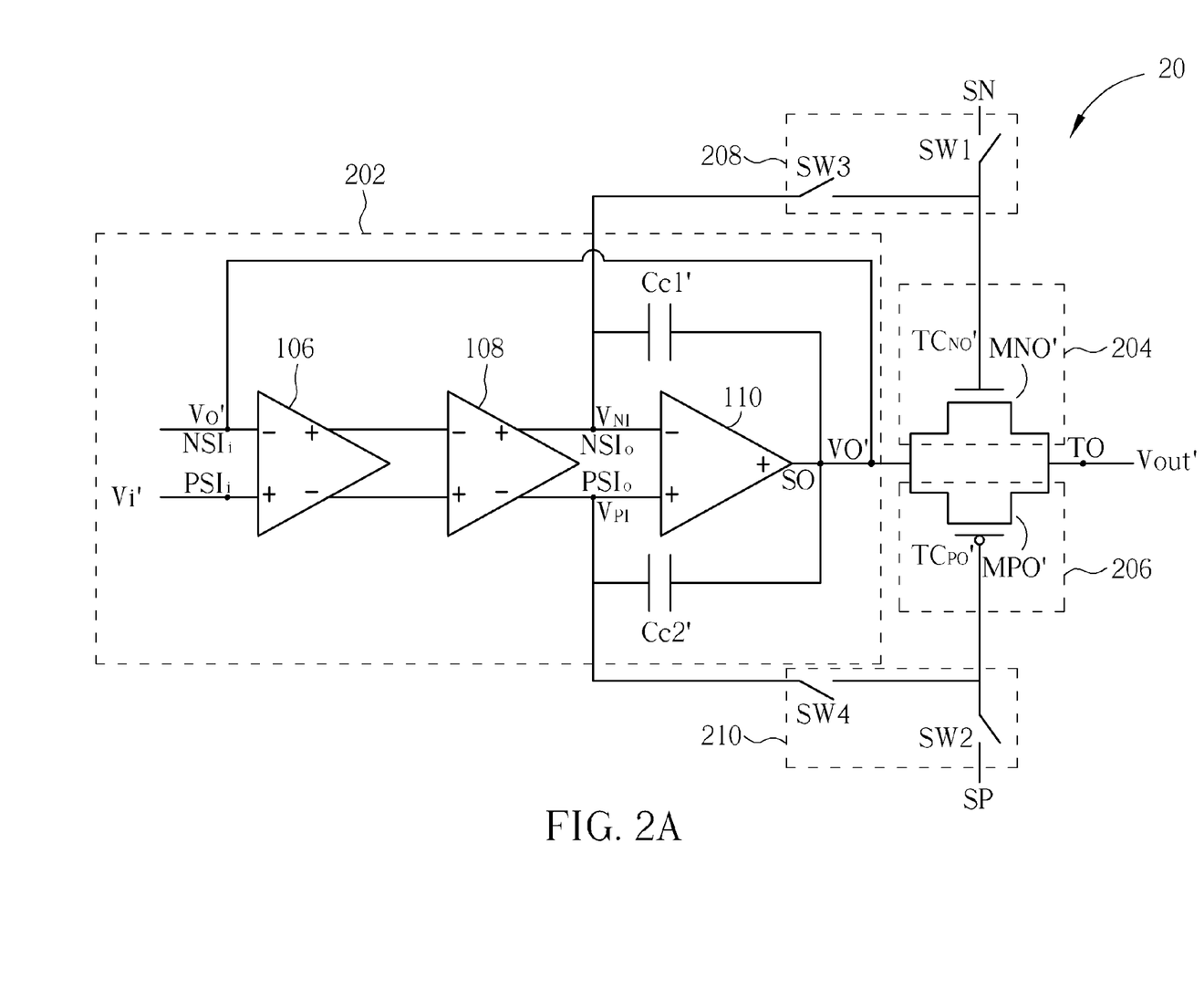
FIG. 2A is a functional block diagram of an operational amplifier device according to an embodiment of the present invention.

Please refer to FIG. 2A, which is a functional block diagram of an operational amplifier device 20 according to an embodiment. The operational amplifier device 20 includes an operational amplifier 202, transmission gates 204, 206 and switch modules 208, 210. The operational amplifier device 20 and the operational amplifier device 10 are partially similar, therefore structurally and functionally similar components and signals are denoted by same symbols. The transmission gate 204 and the transmission gate 206 may be implemented by an N-TYPE transistor MN0' and a P-TYPE transistor MP0', respectively, with gate terminals thereof acting as transmission control terminals $TC_{N0}$, and $TC_{P0}$, respectively. A main distinction between the operational amplifier device 20 and the operational amplifier device 10 is that switch modules 208, 210 are added to the operational amplifier device 20, and they can be disposed between a negative signal input terminal $NSI_o$ and the transmission gate 204, and between a positive signal input terminal $PSI_o$ and the transmission gate 206, respectively. The switch modules 208, 210 are utilized to control electrical connections between the negative signal input terminal $NSI_o$ and the transmission control terminal $TC_{N0}$, and between the positive signal input terminal $PSI_o$ and the transmission control terminal $TC_{P0}$, respectively. As described in the following, the switch modules 208, 210 may be suitably switched on/off, such that the transmission gates 204, 206 are utilized not only to transmit an output voltage Vo', but also to act as Miller capacitors during a transmission period to speed up transmission rate and reduce chip area.

Specifically, during a positive voltage transmission period, i.e. when an input voltage Vi and an output voltage Vo' are both positive, the switch module 208 controls the transmission control terminal $TC_{N0}$, of the transmission gate 204 to be coupled to the negative signal input terminal MI,. Since when the output voltage Vo' is maintained equal to the positive input voltage Vi, a voltage $V_{NI}$ is approximately equal to a system voltage $V_{DD}$, which turns on the transmission gate 204 to transmit the output voltage Vo'. Concurrently, since the transmission gate 204 has the transmission control terminal $TC_{N0}$, coupled to the negative signal input terminal $NSI_o$, while having another terminal coupled to a signal output terminal SO, the transmission gate 204 may further act as a Miller capacitor. Simply put, during the positive voltage transmission period, the transmission gate 204 provides a dual function—voltage transmission and capacitance compensation.

Similarly, during a negative voltage transmission period, i.e. when the input voltage Vi and the output voltage Vo' are negative, the switch module 210 controls the transmission control terminal $TC_{P0}$, of the transmission gate 206 to be coupled to the positive signal input terminal $PSI_o$. Since when the output voltage Vo' is maintained equal to the positive input voltage Vi, a voltage $V_{PI}$ is approximately equal a ground level, which turns on the transmission gate 206 to transmit the output voltage Vo'. Concurrently, since the transmission gate 206 has the transmission control terminal $TC_{P0}$, coupled to the positive signal input terminal $PSI_o$, while having another terminal coupled to the signal output terminal SO, the transmission gate 206 may further act as a Miller capacitor. Thus, during the negative voltage transmission period, the transmission gate 206 provides a dual function—voltage transmission and capacitance compensation.

Consequently, since the transmission gates 204 and 206 can act as Miller capacitors to increase stability of the operational amplifier 202 during the positive voltage transmission period and the negative voltage transmission period, respectively, it is possible to utilize smaller capacitance Miller capacitors Cc1' and Cc2' in the operational amplifier 202, as compared to the Miller capacitors Cc1 and Cc2 of the operational amplifier 102 utilized in the prior art. Moreover, it is even possible to remove the Miller capacitors Cc1' and Cc2' altogether. Accordingly, chip area can be reduced. Furthermore, since the Miller capacitors Cc1' and Cc2' can be reduced or removed, charge/discharge rates during charge/discharge periods and transmission periods can be increased; alternatively, the same charge/discharge rates can be achieved, while a power consumption of the operational amplifier 202 can be reduced.

FIG. 2A also shows a detailed structure of the switch module 208 according to an embodiment. In this embodiment, the switch module 208 may include a coupling switch SW3 coupled between the negative signal input terminal $NSI_o$ and the control transmission control terminal $TC_{N0'}$, to control an electrical connection between the negative signal input terminal $NSI_o$ and the control transmission control terminal $TC_{N0'}$. Moreover, the switch module 208 may further include a control switch SW1 coupled between the transmission control terminal $TC_{N0'}$ and the transmission control signal SN, to control an electrical connection between the transmission control terminal $TC_{N0'}$ and the transmission control signal SN. Similarly, the switch module 210 may include a coupling switch SW4 coupled between the positive signal input terminal $PSI_o$ and the control transmission control terminal $TC_{P0'}$, to control an electrical connection between the positive signal input terminal PSI, and the control transmission control terminal $TC_{P0'}$. Furthermore, the switch module 210 may further include a control switch SW2 coupled between the transmission control terminal $TC_{P0'}$ and the transmission control signal SP, to control an electrical connection between the transmission control terminal $TC_{P0'}$ and the transmission control signal SP.

Figure 2B:
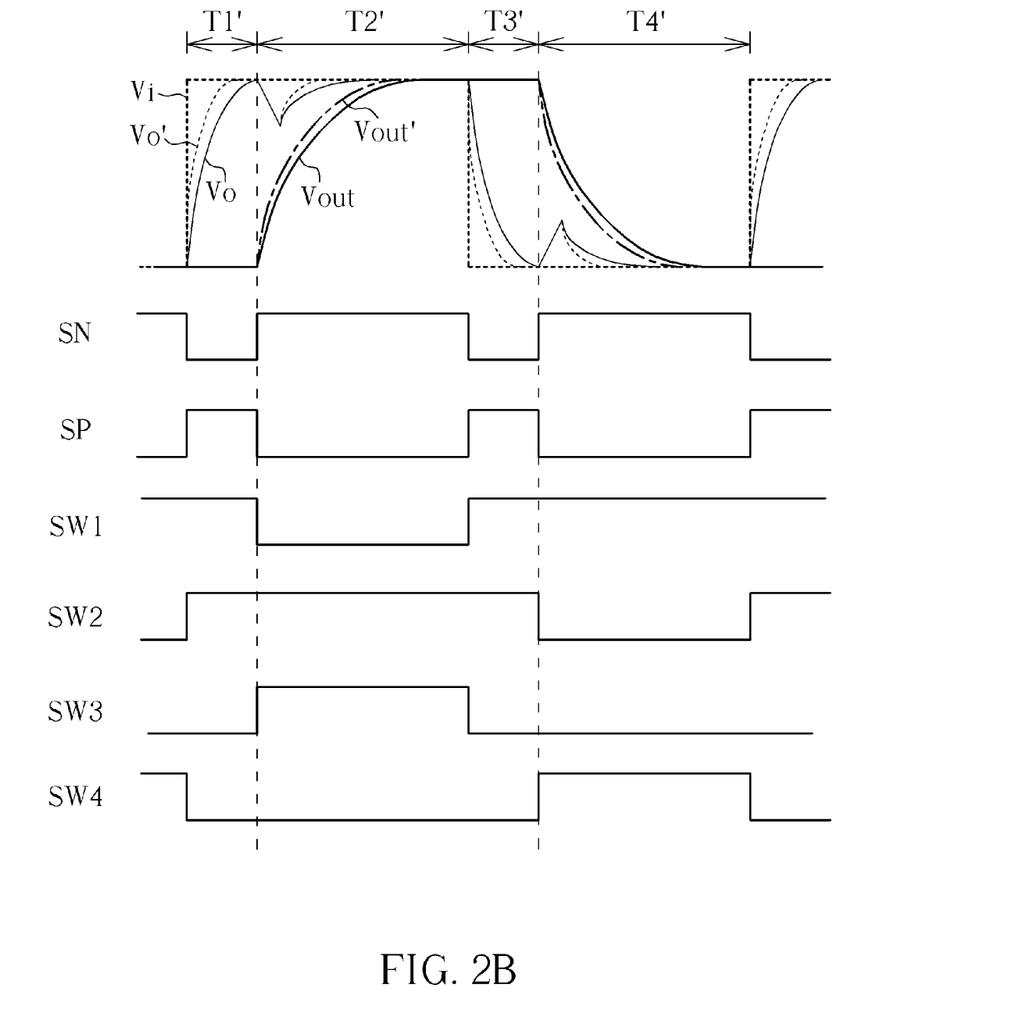
FIG. 2B is a schematic diagram of an input voltage, output voltages, transmission control signals and switch signals shown in FIG. 2A and FIG. 1A.

Please refer to FIG. 2B, which is a schematic diagram of the input voltage Vi, output voltages Vo, Vo', Vout, Vout', the transmission control signals SN and SP and signals of the switches SW1-SW4 shown in FIGS. 2A and 1A, to illustrate operations of the switch module 208 shown in FIG. 2A. Note that, in FIG. 2B, switching signals(not shown) for controlling the control switches SW1, SW2 and the coupling switches SW3, SW4 are also denoted by SW1, SW2 and SW3, SW4, respectively.

As shown in FIG. 2B, during a charge period T1', the input voltage Vi is at a high voltage level, so the gain stage 108 charges the output voltage Vo' to the high voltage level of the input voltage Vi. Moreover, switching signals for the control switches SW1, SW2 are both set to a high voltage level, and switching signals for the coupling switches SW3, SW4 are both set to a low voltage level. Under such configuration of the switching signals, the transmission control terminal $TC_{N0'}$ and the transmission control terminal $TC_{P0'}$ are coupled to the transmission control signals SN and SP of a low voltage level and a high voltage level, respectively, turning off the transmission gates 204, 206 (i.e. the transistors MN0' and MP0'). Accordingly, the output voltage Vout' of the transmission output terminal is at the low voltage level (e.g. 0). Note that, the operational amplifier 202 may utilize the Miller capacitors Cc1' and Cc2' of smaller capacitances, or even it can remove the Miller capacitors Cc1' and Cc2' altogether. The gain stage 108 can thus charge the output voltage Vo' at a higher rate.

Next, during the positive voltage transmission period T2', the output voltage Vo' is maintained at the high voltage level. However, the transmission control signals SN and SP can be switched to a high voltage level and a low voltage level, respectively. Moreover, the switching signals of the control switch SW1 and the coupling switch SW3 are set to a low voltage level and a high voltage level, respectively, such that the transmission control terminal $TC_{N0'}$ is coupled to the negative signal input terminal $NSI_o$, and not coupled to the transmission control signal SN of the high voltage level. Since the output voltage Vo' is kept at the input voltage Vi, the voltage $V_{NI}$ is approximately equal to the system voltage $V_{DD}$, which turns on the transmission gate 204. The conducted transmission gate 204 can not only transmit the output voltage Vo', but can also act as a Miller capacitor to increase stability of the output voltage Vout'. On the other hand, the switching signals of the control switch SW2 and the coupling switch SW4 are set to a high voltage level and low voltage level, respectively, such that the transmission control terminal $TC_{P0'}$ is coupled to the transmission control signal SP of the low voltage level, and not coupled to the positive signal input terminal $PSI_o$. Therefore, the transmission gate 206 is conducted to transmit the output voltage Vo'. When both the transmission gates 204 and 206 are conducting, the output voltage Vout' of the transmission output terminal TO receives the output voltage Vo' of a high voltage level to be charged thereby. Charge sharing occurs between the output voltage Vo' and the output voltage Vout', causing the output voltage Vo' to decrease. Next, negative feedback takes place, leasing the gain stage 108 to again charge the output voltage Vo' to a high voltage level of the input voltage Vi, further charging the output voltage Vout' to the high voltage level of the input voltage Vi. Note that, since the operational amplifier 202 utilizes the Miller capacitors Cc1' and Cc2' of smaller capacitances, or even does not include the Miller capacitors Cc1' and Cc2', the charge rate of the output voltages Vo', Vout' can be increased to charge the external load more rapidly.

Similarly, during the discharge period T3', the input voltage Vi is switched to a low voltage level; thus, the gain stage 108 discharges the output voltage Vo' to a low voltage level of the input voltage Vi. Moreover, the transmission control signals SN and SP can be switched to a low voltage level and a high voltage level, respectively. The switching signals of the control switch SW1, SW2 can both be set to a high voltage level, and the switching signals of the coupling switches SW3, SW4 are both set to low voltage levels, leading the transmission control terminal $TC_{N0'}$ and the transmission control terminal $TC_{P0'}$ to be coupled to the transmission control signals SN and SP of a low voltage level and a high voltage level, respectively. This causes both the transistors MN0' and MP0' in the transmission gates 204, 206 to be turned off, resulting in the output voltage Vout' of the transmission output terminal to drop to the low voltage level (e.g. 0). Note that, since the operational amplifier 202 utilizes the Miller capacitors Cc1' and Cc2' of smaller capacitances, or even does not include the Miller capacitors Cc1' and Cc2', the discharge rate of the output voltage Vo' can be increased.

Next, during the negative voltage transmission period T4', the input voltage Vi is maintained at the low voltage level. However, the transmission control signals SN and SP can be switched to the low voltage level and the high voltage level, respectively. Moreover, the control switch SW1 and the coupling switch SW3 can be set to the high voltage level and the low voltage level, respectively, such that the transmission control terminal $TC_{N0'}$ is coupled to the transmission control signal SN of the high voltage level, and not coupled to the negative signal input terminal $NSI_o$, thereby conducting the transmission gate 204 to transmit the output voltage Vo'. On the other hand, the control switch SW2 and the coupling switch SW4 can be set to the low voltage level and the high voltage level, respectively, such that the transmission control terminal $TC_{P0'}$ is not coupled to the transmission control signal SP but to the positive signal input terminal $PSI_o$. Since the output voltage Vo' is kept at the input voltage Vi, the voltage $V_{PI}$ is approximately equal to the ground level, which turns on the transmission gate 206. The conducted transmission gate 206 can not only transmit the output voltage Vo', but can also further act as a Miller capacitor to increase the stability of the output voltage Vout'. When the transmission gates 204 and 206 are both conducting, the output voltage Vout' of the transmission output terminal TO receives the output voltage Vo' of the low voltage level and is discharged by the output voltage Vo', while the output voltage Vo' rises because of charge sharing with the output voltage Vout'. Next, negative feedback causes the gain stage 108 to discharge the output voltage Vo' to the low voltage level of the input voltage Vi, further discharging the output voltage Vout' to the low voltage level of the input voltage Vi. Note that, since the operational amplifier 202 utilizes the Miller capacitors Cc1' and Cc2' of smaller capacitances, or even does not include the Miller capacitors Cc1' and Cc2', the discharge rates of the output voltages Vo', Vout' can be increased to discharge the external load more rapidly.

In summary, because during the positive voltage transmission period T1' the switch module 208 can be utilized to couple the negative signal input terminal NSI° to the transmission control terminal $TC_{NO'}$ of the transmission gate 204, the high voltage level of the voltage $V_{NI}$ causes the transmission gate 204 to conduct. As a result, the transmission gate 204 can not only be utilized to transmit the output voltage Vo', but can also act as a Miller capacitor. Similarly, during the negative voltage transmission period T3', the switch module 208 can be utilized to couple the positive signal input terminal $PSI_o$ to the transmission control terminal $TC_{PO'}$, thus the low voltage level of the voltage $V_{PI}$ causes the transmission gate 206 to conduct. As a result, the transmission gate 206 can not only be used to transmit the output voltage Vo', but can also act as a Miller capacitor. Since the transmission gate 204 and the transmission gate 206 can serve as Miller capacitors, the operational amplifier 202 needs only further dispose the Miller capacitors Cc1' and Cc2' of smaller capacitances, or it even does not need to utilize any extra Miller capacitors Cc1' and Cc2'. Consequently, chip area may be reduced, and charge/discharge rates may be increased. Alternatively, it is possible for the operational amplifier 102 to achieve the same charge/discharge rates while consuming less power.

Note that, the above-mentioned transmission gate 204 and the transmission gate 206 are illustrated using the N-TYPE transistor MN0' and the P-TYPE transistor MP0' respectively. However, apart from being metal-oxide-semiconductor field effect transistors (MOSFET), the transistors may be metal semiconductor field effect transistors (MESFET) or any other electronic components with switching and capacitance characteristics. Furthermore, the switch module 208 utilizes the coupling switch SW3 and the control switch SW1 to control the electrical connections between the transmission control terminal $TC_{NO'}$ and the negative signal input terminal $NSI_o$, and the transmission control signal SN, respectively. The switch module 210 utilizes the coupling switch SW4 and the control switch SW2 to control electrical connections between the transmission control terminal $TC_{PO'}$ and the positive signal input terminal $PSI_o$, and the transmission control signal SN, respectively. In practice, however, any other configuration may be adopted, as long as it is possible to couple the transmission control terminal $TC_{NO'}$ to the negative signal input terminal $NSI_o$, or further control the transmission control terminal $TC_{NO'}$ to not couple to the transmission control signal SN during the positive voltage transmission period; and to couple the transmission control terminal $TC_{PO'}$ to the positive signal input terminal PSI, or further control the transmission control terminal $TC_{PO'}$ to not couple to the transmission control signal SP during the negative voltage transmission period.

Moreover, the operational amplifier device 20 in FIG. 2A includes both the switch modules 208 and 210, which allow the transmission gate 204 and the transmission gate 206 to be used as Miller capacitors during the positive voltage transmission period and the negative voltage transmission period, respectively. In practice, the operational amplifier device 20 may include only one of the switch modules 208, 210, to utilize only the transmission gate 204 as a Miller capacitor during the positive voltage transmission period, or to utilize only the transmission gate 206 as a Miller capacitor during the negative voltage transmission period. In other words, the total number of the switch modules is not limited to two, but may also be one. Moreover, in other operational amplifier devices with more inputs and outputs, more switch modules may be disposed.

For example, the operational amplifier device 20 may also include the operational amplifier 202 with a plurality of signal input terminals, a plurality of corresponding transmission gates and a plurality of switch modules. Therefore during a first transmission period, at least one of the plurality of switch modules controls the at least one corresponding signal input terminal to be electrically connected to the at least one corresponding transmission control terminal, to conduct the at least one corresponding transmission gate, such that the at least one transmission control terminal transmits the output voltage Vo' and concurrently acts as a Miller capacitor. Moreover, at least another one of the plurality of switch modules controls the at least one corresponding transmission control terminal to be coupled to at least one transmission control signal, to conduct at least another corresponding transmission gate, which therefore can only transmit the output voltage Vo'.

In summary, the prior art often uses bigger Miller capacitors to increase stability of operational amplifiers. However, this approach increases internal charge/discharge time for the Miller capacitor in the operational amplifier, and may additionally result in the output stage of the operational amplifier not fully turning on, and a decrease in charge/discharge rates for the load. Comparatively, the above-mentioned embodiments add switch modules between the signal input terminal and the transmission gate to control the transmission gate to conduct during the transmission period, and concurrently utilize the transmission gate as a Miller capacitor. As a result, the operational amplifier may utilize smaller capacitances Miller capacitors, or even not use Miller capacitors at all, thus reducing the required chip area and increasing charge/discharge rates, or achieving the same charge/discharge rates while lowering operational amplifier power consumption.

Those skilled in the art will readily observe that numerous modifications and alterations of the device and method may be made while retaining the teachings of the invention.

What is claimed is:

1. An operational amplifier device, comprising:
   an operational amplifier, comprising an output stage, which comprises a first signal input terminal and a signal output terminal, and outputs an output voltage at the signal output terminal;
   a first transmission gate, coupled between the signal output terminal and a transmission output terminal, and comprising a first transmission control terminal; and
   a first switch module, for controlling an electrical connection between the first signal input terminal and the first transmission control terminal;
   wherein during a first transmission period, the first switch module controls the first transmission control terminal to be coupled to the first signal input terminal, thereby conducting the first transmission gate to transmit the output voltage.

2. The operational amplifier device of claim 1, wherein during the first transmission period, the first transmission gate further acts as a Miller capacitor.

3. The operational amplifier device of claim 1, wherein the first switch module further controls an electrical connection between the first transmission control terminal and a first transmission control signal.

4. The operational amplifier device of claim 3, wherein during the first transmission period, the first switch module further controls the first transmission control terminal to be not coupled to the first transmission control signal.

5. The operational amplifier device of claim 1, wherein the first switch module comprises a first coupling switch, coupled between the first signal input terminal and the first transmission control terminal.

6. The operational amplifier device of claim 5, wherein the first switch module further comprises a first control switch, coupled between the first transmission control terminal and a first transmission control signal.

7. The operational amplifier device of claim 1 further comprising:
a second transmission gate, coupled between the signal output terminal and the transmission output terminal, and comprising a second transmission control terminal; and
a second switch module, for controlling an electrical connection between the second signal input terminal and the second transmission control terminal.

8. The operational amplifier device of claim 7, wherein during the first transmission period, the second switch module controls the second signal input terminal to be not electrically connected to the second transmission control terminal.

9. The operational amplifier device of claim 8, wherein the second switch module further controls an electrical connection between the second transmission control terminal and a second transmission control signal.

10. The operational amplifier device of claim 9, wherein during the first transmission period, the first switch module controls the second transmission control terminal to be coupled to the second transmission control signal, wherein the second transmission control signal controls the second transmission gate to conduct.

11. The operational amplifier device of claim 7, wherein the second switch module comprises a second coupling switch, coupled between the second signal input terminal and the second transmission control terminal.

12. The operational amplifier device of claim 11, wherein the second switch module further comprises a second control switch, coupled between the first transmission control terminal and a second transmission control signal.

13. The operational amplifier device of claim 7, wherein during a second transmission period, a level of the output voltage is different from a level of the output voltage during the first transmission period, and the first switch module controls the first transmission control terminal to be not coupled to the first signal input terminal, and the second switch module controls the second transmission control terminal to be coupled to the second signal input terminal, thereby conducting the second transmission gate.

14. The operational amplifier device of claim 13, wherein during the second transmission period, the first switch module controls the first transmission control terminal to be coupled to a first transmission control signal, wherein the first transmission control signal controls the first transmission gate to conduct, and the second switch module controls the second transmission control terminal to be not coupled to a second transmission control signal.

15. The operational amplifier device of claim 7, wherein the first and second transmission gate comprise a first type transistor and a second type transistor, respectively, wherein each of the first type transistor and the second type transistor is coupled between the transmission input terminal and the transmission output terminal, and has a gate as one of the first transmission control terminal and the second transmission control terminal.

16. An operational amplifier device, comprising:
an operational amplifier, comprising an output stage, which comprises a plurality of signal input terminals and a signal output terminal for outputting an output voltage;
a plurality of transmission gates, coupled in parallel between the signal output terminal and a transmission output terminal, and each having one of a plurality of transmission control terminals, respectively; and
a plurality of switch modules, each for controlling an electrical connection between the signal input terminal and a corresponding transmission control terminal of the plurality of transmission control terminals;
wherein, during a transmission period, at least one of the plurality of switch modules controls the at least one corresponding signal input terminal to be electrically connected to the at least one corresponding transmission control terminal, thereby conducting the at least one corresponding transmission gate.

17. The operational amplifier device of claim 16, wherein during the transmission period, at least another switch module of the plurality of switch modules further controls at least another corresponding transmission control terminal to be coupled to at least one transmission control signal, respectively, thereby conducting at least another corresponding transmission gate.

18. An operational amplifier device, comprising:
an operational amplifier, comprising an output stage for outputting an output voltage;
a transmission gate, coupled to the output stage for receiving the output voltage; and
a switch module, for controlling an electrical connection between the transmission gate and the output stage;
wherein during a transmission period, the switch module controls the transmission gate to conduct to transmit the output voltage and to act as a Miller capacitor to compensate for the output voltage.

19. The operational amplifier device of claim 18, wherein a terminal of the transmission gate is coupled to a signal output terminal of the output stage to receive the output voltage, and during the transmission period, another terminal of the transmission gate is coupled to a signal input terminal of the output stage.

* * * * *